United States Patent
Tominaga

(10) Patent No.: US 12,119,327 B2
(45) Date of Patent: Oct. 15, 2024

(54) METHOD FOR MANUFACTURING STACK COMPONENTS

(71) Applicant: FUJI CORPORATION, Chiryu (JP)

(72) Inventor: Ryojiro Tominaga, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 490 days.

(21) Appl. No.: 17/630,870

(22) PCT Filed: Jul. 30, 2019

(86) PCT No.: PCT/JP2019/029821
§ 371 (c)(1),
(2) Date: Jan. 27, 2022

(87) PCT Pub. No.: WO2021/019684
PCT Pub. Date: Feb. 4, 2021

(65) Prior Publication Data
US 2022/0271010 A1    Aug. 25, 2022

(51) Int. Cl.
*B33Y 80/00* (2015.01)
*H01L 25/065* (2023.01)
*H05K 3/10* (2006.01)
*H05K 3/46* (2006.01)

(52) U.S. Cl.
CPC ........... *H01L 25/0657* (2013.01); *H05K 3/10* (2013.01); *H05K 3/46* (2013.01); *B33Y 80/00* (2014.12)

(58) Field of Classification Search
CPC ............ H05K 3/46; H05K 3/10; H05K 1/144; H05K 2201/10303; B33Y 80/00; H01L 25/0657
See application file for complete search history.

(56) References Cited

U.S. PATENT DOCUMENTS

2020/0346452 A1    11/2020  Tominaga

FOREIGN PATENT DOCUMENTS

| EP | 2 141 972 A1 | 1/2010 |
| JP | 7-193350 A | 7/1995 |
| JP | 2001-352176 A | 12/2001 |
| WO | WO 2019/102522 A1 | 5/2019 |

OTHER PUBLICATIONS

International Search Report mailed on Oct. 15, 2019 in PCT/JP2019/029821 filed on Jul. 30, 2019, 2 pages.

*Primary Examiner* — Walter H Swanson
*Assistant Examiner* — Jacob T Nelson
(74) *Attorney, Agent, or Firm* — Oblon, McClelland, Maier & Neustadt, L.L.P.

(57) ABSTRACT

A method for manufacturing a stack component in which an interposer is interposed to form a space for inserting an interlayer connection pin between circuit layers to be stacked, the method includes a printing step of simultaneously printing and forming the circuit layer and the interposer side by side in a planar manner by a 3D printer, a step of mounting a circuit element on the circuit layer, a step of mounting the interposer on the circuit layer, a step of inserting the interlayer connection pin into the interposer mounted on the circuit layer, and a step of electrically connecting the circuit layer and another circuit layer by the interlayer connection pin by stacking the other circuit layer on the circuit layer via the interposer.

10 Claims, 4 Drawing Sheets

PRINTING STEP

CIRCUIT ELEMENT MOUNTING STEP

INTERPOSER MOUNTING STEP

INTERLAYER CONNECTION PIN INSERTING STEP

METHOD FOR MANUFACTURING STACK COMPONENTS

TECHNICAL FIELD

The present specification discloses a technique related to a method for manufacturing a stack component in which stacked circuit layers are electrically connected by an interlayer connection pin.

BACKGROUND ART

In a conventional method for manufacturing a stack component, as described in Patent Literature 1 (JP-A-2001-352176), for example, the stack component is manufactured by repeating an operation of using multiple printed circuit boards cut to a predetermined size as multiple circuit layers to be stacked, forming a wiring pattern on each printed circuit board, mounting a circuit element such as a semiconductor chip on each printed circuit board, and thereafter stacking a printed circuit board on an upper layer side via an insulating layer on a printed circuit board on a lower layer side, and inserting an interlayer connection pin into a through hole on the stacked printed circuit board on the upper layer side to electrically connect between two layers of printed circuit boards.

PATENT LITERATURE

Patent Literature 1: JP-A-2001-352176

BRIEF SUMMARY

Technical Problem

Since the manufacturing method of Patent Literature 1 described above requires many labor-intensive steps, it has a disadvantage that productivity is poor and a manufacturing cost is high. In addition, since a degree of freedom in design is small, and it is not possible to sufficiently meet the demands for variety and high density of the stacking structure.

Solution to Problem

In order to solve the above problem, there is provided a method for manufacturing a stack component in which a circuit element is mounted on at least one circuit layer of multiple circuit layers to be stacked, the circuit layers are electrically connected by an interlayer connection pin, and an interposer is interposed to form a space for inserting the interlayer connection pin between the circuit layers, the method including: a printing step of simultaneously printing and forming the circuit layer and the interposer side by side in a planar manner by a 3D printer; a step of mounting the circuit element on the circuit layer; a step of mounting the interposer on the circuit layer; a step of inserting the interlayer connection pin into the interposer mounted on the circuit layer; and a step of electrically connecting the circuit layer and another circuit layer by the interlayer connection pin by stacking the other circuit layer on the circuit layer via the interposer.

In the manufacturing method, a circuit layer and an interposer are simultaneously printed and formed side by side in a planar manner by a 3D printer, and then the interposer is mounted on the circuit layer to assemble the stack component. According to the manufacturing method, it is possible to efficiently form the circuit layer and the interposer simultaneously, and it is also easy to diversify the variations of the circuit layer and the interposer. By adopting a configuration in which the interlayer connection pin is inserted into the interposer mounted on the circuit layer to electrically connect the circuit layers, it is also easy to diversify and increase the density of the stacking structure.

DESCRIPTION OF EMBODIMENTS

Hereinafter, an embodiment disclosed in the present specification will be described. Each step of a method for manufacturing a stack component of the embodiment will be described with reference to FIGS. 1A to 1D.

Figure 1A:
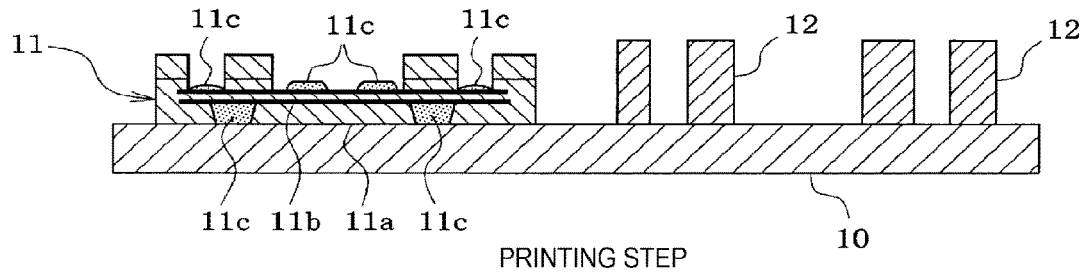
FIG. 1A is a vertical sectional view illustrating a printing step in a method for manufacturing a stack component according to an embodiment.

First, as illustrated in FIG. 1A, 3D printer (not illustrated) is used to perform a printing step of simultaneously printing and forming circuit layer 11 and interposer 12 side by side in a planar manner on printing stage 10 on which a print object is mounted. Interposer 12 functions as a spacer forming a space (insertion hole) for inserting interlayer connection pin 13 between circuit layers 11 to be stacked.

In the printing step, at least one circuit layer 11 among multiple circuit layers 11 to be stacked is simultaneously printed with interposer 12 side by side in a planar manner, and, in a case of printing multiple circuit layers 11, multiple circuit layers 11 are simultaneously printed and formed with interposer 12 side by side in a planar manner. In a case of printing interposers 12 for multiple layers, interposers 12 for multiple layers are simultaneously printed and formed with circuit layers 11 side by side in a planar manner.

In a case where a printing space on printing stage 10 is insufficient so that all of multiple circuit layers 11 and interposers 12 to be stacked cannot be simultaneously printed side by side in a planar manner, the printing step may be divided into two or more steps. In addition, some of circuit layers 11 and/or some of interposers 12 may be formed by another forming method.

When each circuit layer 11 is printed, insulating layer 11a, wiring pattern 11b, terminal section 11c, and the like are printed and formed. Insulating layer 11a is formed by printing insulating ink such as UV resin ink. Wiring pattern 11b and terminal section 11c are formed by printing a conductive paste, nanosilver ink, or the like. Each interposer 12 is formed by printing insulating ink such as UV resin ink in the same manner as insulating layer 11a.

Figure 1B:
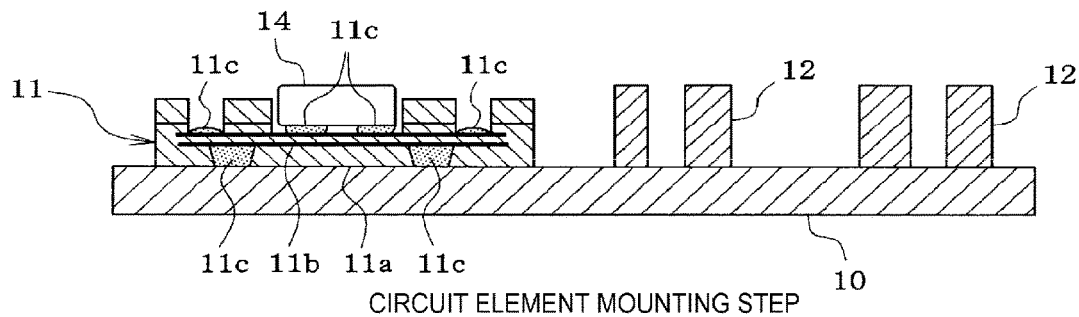
FIG. 1B is a vertical sectional view illustrating a circuit element mounting step in the method for manufacturing a stack component according to the embodiment.
Figure 4:
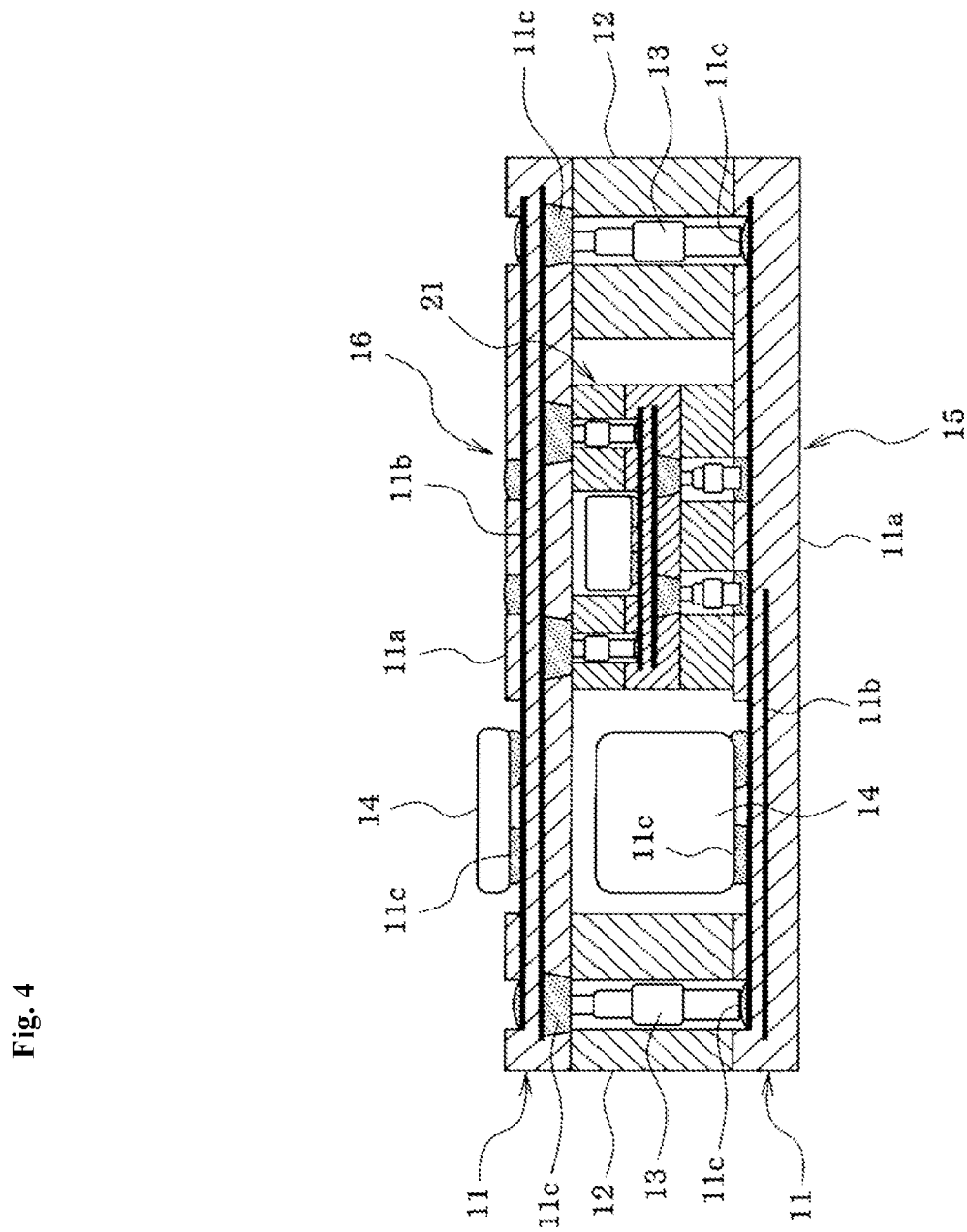
FIG. 4 is a vertical sectional view illustrating a configuration example of a stack component of mixed stacking.
Figure 6:
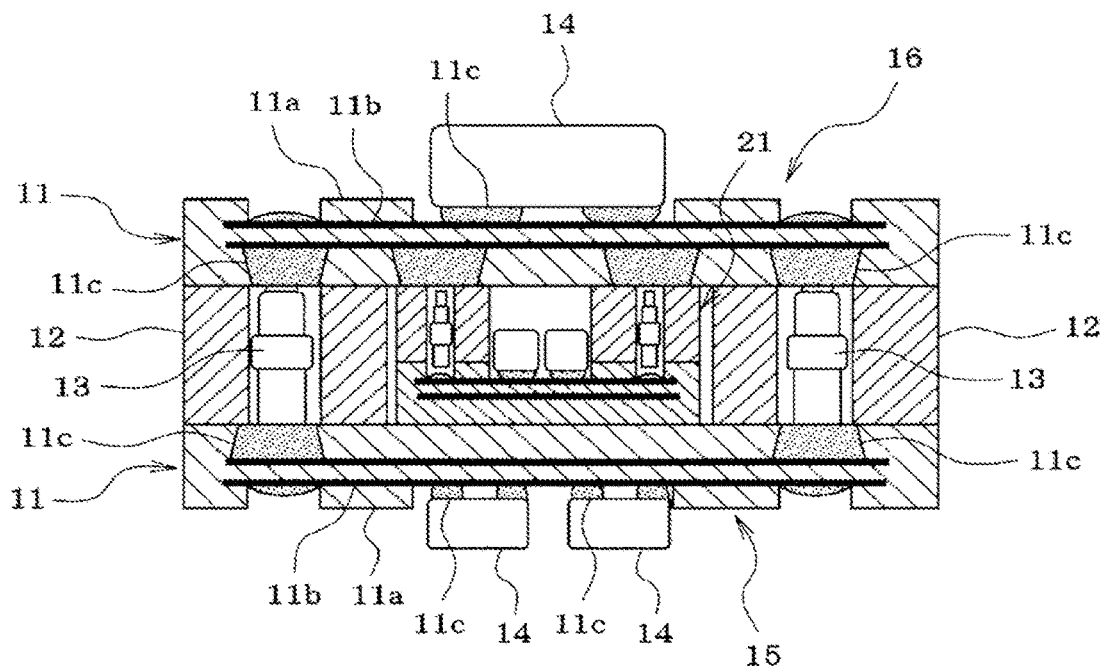
FIG. 6 is a vertical sectional view illustrating a configuration example of a stack component of stacking in the double-sided plate shape with a built-in small-sized stack component.

After the printing step is completed, the process proceeds to a circuit element mounting step, and as illustrated in FIG. 1B, circuit element 14 such as a semiconductor chip is mounted at a predetermined position on printed circuit layer 11 by a mounting technique, for example, a surface mounting such as flip-chip bonding, wire bonding, or the like, and thus a terminal of circuit element 14 on a lower surface is connected to terminal section 11c of circuit layer 11. As illustrated in FIGS. 4 and 6 to be described later, small-sized stack component 21 manufactured by the manufacturing method of the embodiment may be mounted at a predetermined position on circuit layer 11.

Figure 1C:
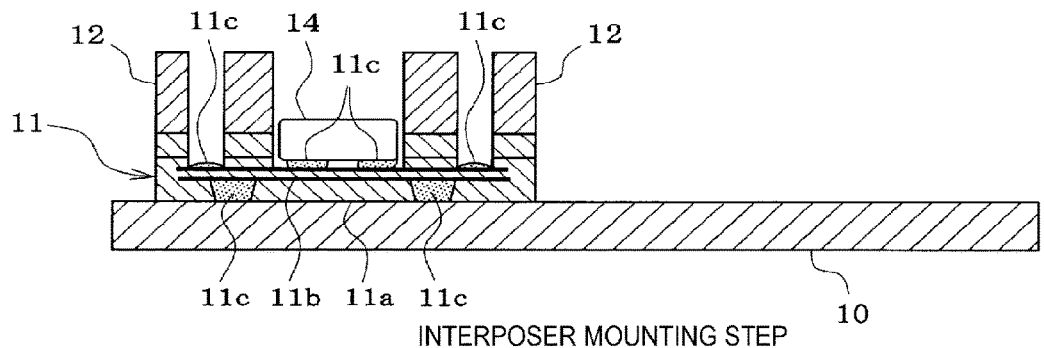
FIG. 1C is a vertical sectional view illustrating an interposer mounting step in the method for manufacturing a stack component according to the embodiment.

After the circuit element mounting step is completed, the process proceeds to an interposer mounting step, as illustrated in FIG. 1C, interposer 12 formed on printing stage 10 is peeled from printing stage 10, and interposer 12 is mounted and bonded at a predetermined position on circuit layer 11.

Figure 1D:
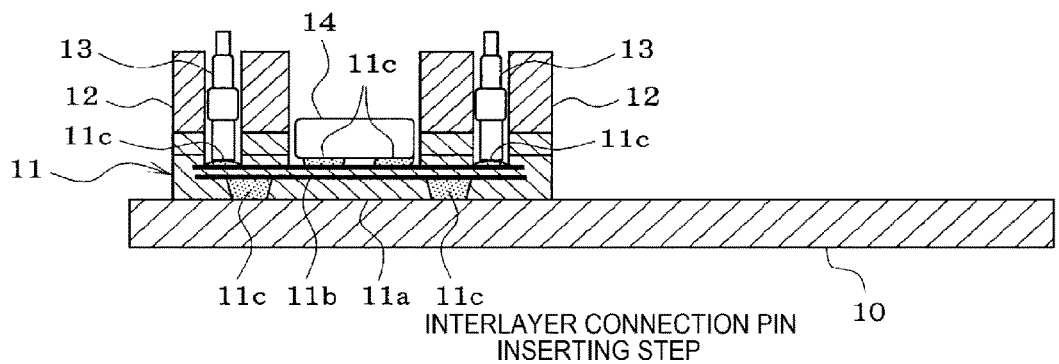
FIG. 1D is a vertical sectional view illustrating an interlayer connection pin inserting step in the method for manufacturing a stack component according to the embodiment.

After the interposer mounting step is completed, the process proceeds to an interlayer connection pin inserting step, as illustrated in FIG. 1D, interlayer connection pin 13 is inserted into interposer 12 mounted on circuit layer 11, and a lower end of interlayer connection pin 13 is electrically connected to terminal section 11c of circuit layer 11. Interlayer connection pin 13 used in the embodiment includes a spring (not illustrated), and an upper end portion thereof is configured to be extendable and contractible by the spring. Accordingly, in a state in which interlayer connection pin 13 is inserted into interposer 12, the upper end portion of interlayer connection pin 13 protrudes upward from an upper end of interposer 12.

As described above, unit 15 of the first layer is assembled. Units 16 of the second layer and subsequent layers are assembled in the same manner. Thereafter, multiple units 15 and 16 are stacked to manufacture a stack component. At this time, unit 16 on an upper layer side is stacked on unit 15 on a lower layer side, and circuit layer 11 of unit 16 on the upper layer side is stacked on circuit layer 11 of unit 15 on the lower layer side via interposer 12, and thus circuit layer 11 of unit 15 on the lower layer side and circuit layer 11 of unit 16 on the upper layer side are electrically connected by interlayer connection pin 13. At this time, the upper end portion of interlayer connection pin 13 contacts and is pushed into terminal section 11c of circuit layer 11 of unit 16 on the upper layer side, so that an electrical connection therebetween is ensured. Instead of unit 16 on the upper layer side, only circuit layer 11 may be stacked.

In the manufacturing method of the embodiment, stack components having various stacking structures illustrated in FIGS. 2 to 6 can be assembled.

Figure 2:
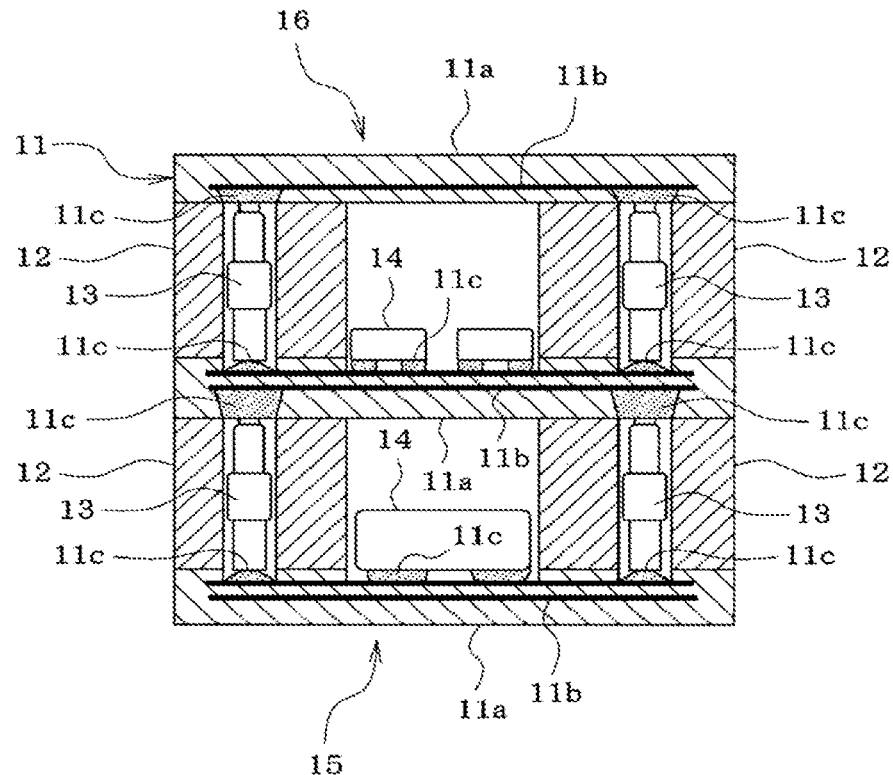
FIG. 2 is a vertical sectional view illustrating a configuration example of a stack component of vertical stacking.

A stack component of vertical stacking illustrated in FIG. 2 is a stack component in which two units 15 and 16 are stacked so as to be simply piled up, and only circuit layer 11 on a component surface side is stacked on unit 16 on the upper layer side. Units 15, 16 for three or more layers may be vertically stacked, and only circuit layer 11 on the component surface side may be stacked on unit 16 of the uppermost layer.

Figure 3:
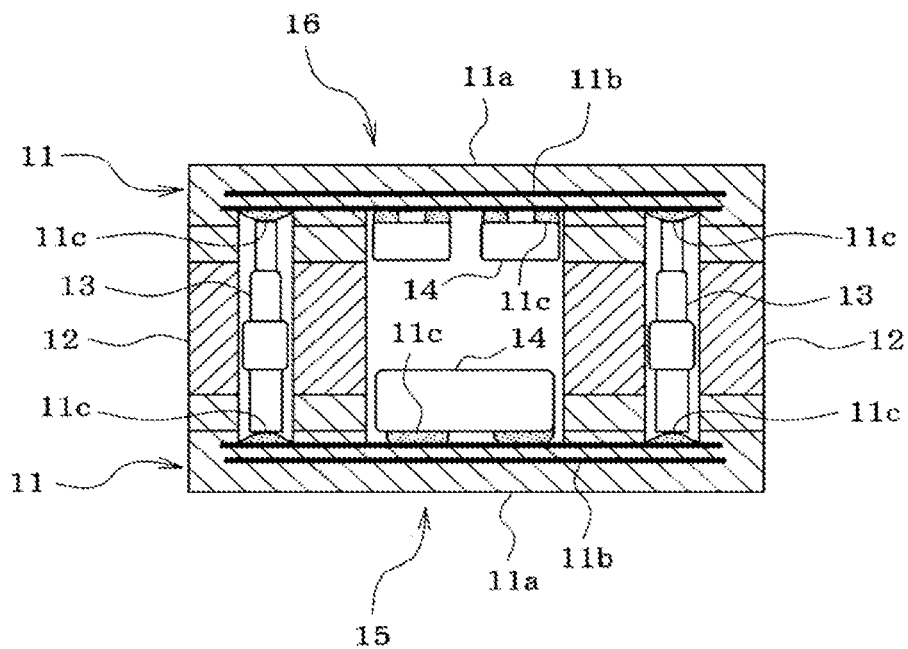
FIG. 3 is a vertical sectional view illustrating a configuration example of a stack component of face-to-face stacking.

A stack component of face-to-face stacking illustrated in FIG. 3 is a stack component in which unit 16 on the upper layer side among two units 15 and 16 is stacked on unit 15 on the lower layer side in a state where unit 16 on the upper layer side is vertically reversed. In this case, in unit 16 on the upper layer side, interposer 12 and interlayer connection pin 13 are not mounted, only circuit element 14 is mounted, and circuit layer 11 of unit 16 on the upper layer side is stacked via interposer 12 of unit 15 on the lower layer side. The stack component of face-to-face stacking are in a state in which circuit element 14 mounted on circuit layer 11 of unit 16 on the upper layer side is facing downward and is accommodated inside the stack component together with circuit element 14 mounted on circuit layer 11 of unit 15 on the lower layer side.

A stack component of mixed stacking illustrated in FIG. 4 is a stack component in which small-sized stack component 21 assembled by the manufacturing method of the embodiment is mounted with circuit element 14 side by side on circuit layer 11 of unit 15 on the lower layer side, and circuit layer 11 on the component surface side is stacked on unit 15 on the lower layer side. Small-sized stack component 21 to be mounted on circuit layer 11 of unit 15 on the lower layer side may be assembled on circuit layer 11 of unit 15 on the lower layer side, or small-sized stack component 21 assembled at another location may be mounted on circuit layer 11 of unit 15 on the lower layer side. Circuit element 14 may be mounted on an upper surface of circuit layer 11 on the component surface side. In this case, since small-sized stack component 21 is mounted on circuit layer 11 of unit 15 on the lower layer side, multiple types of interposers 12 having different lengths (multiple types of interlayer connection pins 13 having different lengths) are mounted on circuit layer 11 of unit 15 on the lower layer side.

Figure 5:
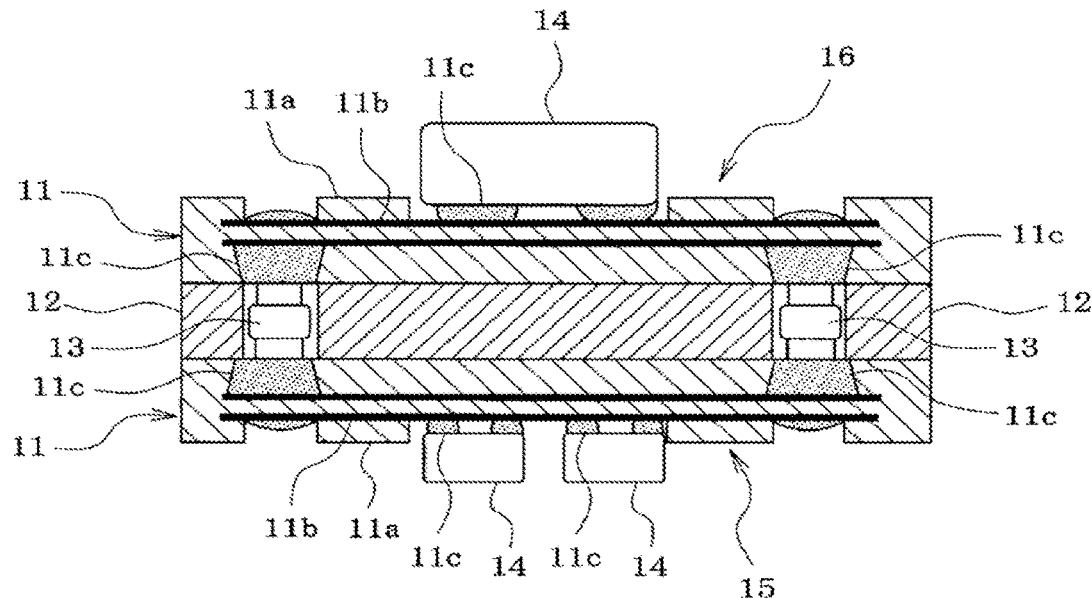
FIG. 5 is a vertical sectional view illustrating a configuration example of a stack component of stacking in a double-sided plate shape.

A stack component of stacking in a double-sided plate shape illustrated in FIG. 5 is a stack component simulating a double-sided build-up board, in which circuit element 14 is mounted on a lower surface of circuit layer 11 of unit 15 on the lower layer side, and circuit element 14 is mounted on an upper surface of circuit layer 11 on the component surface side stacked on unit 15 on the lower layer side. In this case, in unit 16 on the upper layer side, interposer 12 and interlayer connection pin 13 are not mounted, only circuit element 14 is mounted, and circuit layer 11 of unit 16 on the upper layer side is stacked via interposer 12 of unit 15 on the lower layer side. The step of mounting circuit elements 14 on circuit layers 11 of each unit 15 and 16 may be performed before, or may be performed after the step of stacking two units 15 and 16.

A stack component of stacking in the double-sided plate shape illustrated in FIG. 6 is a stack component simulating a double-sided build-up board with a built-in component, and have a configuration in which small-sized stack component 21 is built in between layers of the stack component of stacking in the double-sided plate shape. Built-in small-sized stack component 21 may be assembled on circuit layer 11 of unit 15 on the lower layer side, or small-sized stack component 21 assembled at another location may be mounted on circuit layer 11 of unit 15 on the lower layer side. Other configurations are the same as those of the stack component of stacking in the double-sided plate shape illustrated in FIG. 5.

According to the method for manufacturing a stack component according to the embodiment described above, circuit layer 11 and interposer 12 are simultaneously printed and formed side by side in a planar manner on printing stage 10 by using the 3D printer, interposer 12 peeled from printing stage 10 is mounted on circuit layer 11, and unit 15 (16) is assembled by inserting interlayer connection pin 13 into interposer 12. Accordingly, circuit layer 11 and interposer 12 can be simultaneously and efficiently formed, and variations of circuit layer 11 and interposer 12 can be easily diversified. In addition, since unit 15 (16) for one layer is configured by inserting interlayer connection pin 13 into interposer 12 mounted on circuit layer 11, it is possible to manufacture stack components having various stacking structures illustrated in FIGS. 2 to 6, and it is also easy to diversify and increase the density of the stacking structure.

It is needless to say that the present disclosure is not limited to the configuration of the above embodiment, and can be implemented with various changes within the range not departing from the gist, such as changing the number of stacks of circuit layers 11 and the number of circuit elements 14 to be mounted, or using interlayer connection pin with no built-in spring.

REFERENCE SIGNS LIST

10: printing stage, 11: circuit layer, 11a: insulating layer, 11b: wiring pattern, 11c: terminal section, 12: interposer, 13: interlayer connection pin, 14: circuit element, 15, 16: unit, 21: small-sized stack component

The invention claimed is:

1. A method for manufacturing a stack component in which a circuit element is mounted on at least one circuit layer of multiple circuit layers to be stacked, the circuit layers are electrically connected by an interlayer connection pin, and an interposer is interposed to form a space for inserting the interlayer connection pin between the circuit layers, the method comprising:
a printing step of simultaneously printing and forming the circuit layer and the interposer side by side in a planar manner by a 3D printer;
a step of mounting the circuit element on the circuit layer;
a step of mounting the interposer on the circuit layer;
a step of inserting the interlayer connection pin into the interposer mounted on the circuit layer; and
a step of electrically connecting the circuit layer and another circuit layer by the interlayer connection pin by stacking the other circuit layer on the circuit layer via the interposer.

2. The method for manufacturing a stack component according to claim 1, wherein
in the printing step, the circuit layers of all layers constituting the stack component and the interposer are simultaneously printed and formed side by side in a planar manner.

3. The method for manufacturing a stack component according to claim 1, wherein
some of the circuit layers and/or some of the interposers are formed by another printing step or another forming method.

4. The method for manufacturing a stack component according to claim 1, wherein
the interlayer connection pin is configured to be extendable and contractible by a spring.

5. The method for manufacturing a stack component according to claim 1, wherein
as the interlayer connection pin, multiple types of interlayer connection pins having different lengths are used.

6. The method for manufacturing a stack component according to claim 1, wherein
the circuit element and the interposer are mounted on the same surface of the circuit layer.

7. The method for manufacturing a stack component according to claim 1, wherein
the circuit element is mounted on one surface of the circuit layer, and the interposer is mounted on the other surface.

8. The method for manufacturing a stack component according to claim 1, further comprising:
a step of mounting a circuit element on an upper surface of an uppermost circuit layer and/or on a lower surface of a lowermost circuit layer of the stack component.

9. The method for manufacturing a stack component according to claim 1, further comprising:
a step of manufacturing a small-sized stack component in which the circuit layers of all layers constituting the small-sized stack component and the interposer are simultaneously printed and formed side by side in a planar manner;
a step of mounting the small-sized stack component and the interposer on an upper surface of a circuit layer; and
a step of electrically connecting the circuit layer and another circuit layer by an interlayer connection pin by stacking the other circuit layer on the circuit layer via the small-sized stack component and the interposer.

10. The method for manufacturing a stack component according to claim 1, further comprising:
a step of mounting the circuit element on a lower surface of the other circuit layer before stacking the other circuit layer above the circuit layer.

* * * * *